United States Patent [19]
Park et al.

[11] Patent Number: 6,149,728
[45] Date of Patent: *Nov. 21, 2000

[54] SEMICONDUCTOR MANUFACTURING DEVICE

[75] Inventors: Jae Woo Park, Seoul; Sang Hyun Kim, Chungcheongbuk-do, both of Rep. of Korea

[73] Assignee: Hyundai Electronics Industries Co., Ltd., Kyoungki-do, Rep. of Korea

[*] Notice: This patent issued on a continued prosecution application filed under 37 CFR 1.53(d), and is subject to the twenty year patent term provisions of 35 U.S.C. 154(a)(2).

[21] Appl. No.: 08/841,380

[22] Filed: Apr. 30, 1997

[30] Foreign Application Priority Data

Oct. 24, 1996 [KR] Rep. of Korea ............... 96/48001

[51] Int. Cl.$^7$ ..................................... B05C 11/00

[52] U.S. Cl. ................... 118/712; 118/666; 118/725; 118/728; 118/729

[58] Field of Search .................. 118/724, 725, 118/666, 712, 728, 729

[56] References Cited

U.S. PATENT DOCUMENTS

| | | | |
|---|---|---|---|
| 5,587,019 | 12/1996 | Fujie | 118/725 |
| 5,710,407 | 1/1998 | Moore | 118/725 |
| 5,830,277 | 11/1998 | Johnsgard | 118/725 |

*Primary Examiner*—Richard Bueker
*Assistant Examiner*—Erin Fieler

[57] ABSTRACT

A semiconductor manufacturing device uniformly grows a film on the surface of a wafer and reduces a turnaround time by shortening the time per process unit. The device includes a chamber, a plurality of lamps disposed on the upper end of the chamber to heat the wafer, and a plurality of pyrometers for supporting the wafer inserted into the wafer, detecting the inner temperature of the chamber and supporting the wafer onto a heat board as the wafer is heating to a predetermined temperature. The device further includes the heat board disposed on the lower end of the chamber to hold thereon the wafer lowered by the pyrometers and to keep the processing temperature, a wafer inlet or outlet formed on one side of the chamber, and reaction gas inlet and outlet formed on both sides of the chamber for injecting the reaction gas for growing the film on the wafer as the wafer is lowered onto the heat board.

22 Claims, 3 Drawing Sheets

SEMICONDUCTOR MANUFACTURING DEVICE

BACKGROUND OF THE INVENTION

1. Field of the Invention

The present invention relates to a semiconductor manufacturing device and, more particularly, to a device which when growing a film on a silicon substrate, accurately controls its temperature to thereby obtain a uniform film thickness.

2. Discussion of Related Art

Generally, when manufacturing a semiconductor element, film growth is accomplished by a method for growing a thermo oxide film, a chemical vapor deposition (CVD) method for forming an oxide film, and a method for forming a nitride film using an electrical furnace. The method using the electrical furnace is performed in batch-type (i.e., by the batch), which requires a significant time. As a result, any trivial mistakes occurring while processing a batch may cause defects in the wafer.

The conventional methods for manufacturing semiconductor elements require control over the temperature between the wafers in the chamber. Further, each process unit used in the conventional methods has a fixed time per process unit (time required for a process unit to perform it operation). Often, a significant time per process unit is required because the chamber temperature rises and stabilizes rather slowly. Consequently, it is difficult to reduce the turnaround time (TAT) for producing the semiconductor elements.

Therefore, a method of growing a film with a rapid thermal process unit has been introduced to overcome the above problems and to enhance productivity in accordance with integration of the semiconductor elements and the size of the silicon substrates.

As illustrated in FIG. 1, a conventional semiconductor manufacturing device includes a chamber 11, a plurality of lamps 12 disposed on the upper end of the chamber 11, wafer fixtures 13 disposed on the lower end of the chamber 11, a pyrometer 14 positioned between the wafer fixtures 13 for detecting the chamber temperature, a quartz 15 positioned between the lamps 12 and the wafer, a wafer inlet 16 formed on one side of the chamber 11, a reaction gas inlet 17 formed on the other side of the chamber 11, and a reaction gas outlet 18 formed on one side of the chamber 11.

The operation of the conventional semiconductor manufacturing device will be described below.

As illustrated in FIG. 1, the wafer is inserted into the chamber 11 through the wafer inlet 16, and then placed on the wafer fixtures 13. The lamps 12, used as a heat source, illuminate the chamber 11 and raise the chamber temperature (inside of the chamber) up to a predetermined processing temperature. The pyrometer 14 placed on the rear side of the wafer detects the chamber temperature for monitoring the temperature inside the chamber 11 for a proper film growth.

When the chamber temperature approximately reaches the predetermined processing temperature, the reaction gas is injected into the chamber 11 through the reaction gas inlet 17. For example, in case of growing an oxide film on the wafer surface, an oxygen ($O_2$) gas is injected as the reaction gas. The oxygen gas reacts with the wafer's silicon, causing growth of an oxide film ($SiO_2$). The predetermined processing temperature is obtained by controlling the lamps 12 using, e.g., a control circuit.

The conventional semiconductor manufacturing device as discussed previously, however, has the following problems.

First, since the chamber temperature rapidly rises up to the predetermined processing temperature, an overshoot is generated on the temperature profile, causing the temperature profile to fluctuate.

Second, it is impossible to reduce the turnaround time (TAT) because a predetermined time is required to maintain a stabilized temperature corresponding to the predetermined processing temperature.

Third, uniformity in the film is deteriorated because the film growth speed is not uniform due to unnecessary temperature elevation and temperature difference between the lamps.

SUMMARY OF THE INVENTION

Accordingly, the present invention is directed to a semiconductor manufacturing device which substantially obviates one or more of the problems due to limitations and disadvantages of the related art.

An object of the present invention is to provide a semiconductor manufacturing device which can grow a uniform film by accurately detecting temperature and maintaining the stabilized temperature, and which can reduce turnaround time (TAT).

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the semiconductor manufacturing device includes a chamber, lamps disposed on the upper end of the chamber to be used as a heat source, a plurality of pyrometers for detecting the inner temperature of the chamber, supporting a wafer until the wafer is heated to reach a predetermined temperature with a first heat source and moving the wafer when the predetermined temperature is reached, a heat board disposed on the lower end of the chamber to fix the wafer moved by the pyrometer, the heat board being used as a second heat source for keeping the predetermined processing temperature, a wafer inlet or outlet formed on one side of the chamber, and reaction gas inlet and outlet formed on the sides of the chamber.

It is to be understood that both the foregoing general description and the following detailed description are exemplary and explanatory and are intended to provide further explanation of the invention as claimed.

Briefly described, the present invention is directed to a semiconductor manufacturing device for growing a film on a wafer, including a chamber having a plurality of openings; a first heat source disposed on an upper portion of the chamber; a second heat source disposed on a lower portion of the chamber for placing the wafer thereon; and at least one temperature detector for detecting a temperature of the chamber and being movable between the first and second heat sources.

Furthermore, the present invention is directed to a method for growing a film on a wafer in a chamber including a plurality of openings, a first heat source disposed on an upper portion of the chamber, and a second heat source disposed on a lower portion of the chamber for placing the wafer thereon, the method comprising the steps of supporting the wafer on at least one temperature detector near the first heat source; moving the at least one temperature detector to the second heat source and placing the wafer thereon when the temperature of the chamber reaches a predetermined level; and injecting a reaction gas through the chamber to grow a film on the wafer.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention, wherein.

DETAILED DESCRIPTION OF PREFERRED EMBODIMENTS

Reference will now be made in detail to the preferred embodiments of the present invention, examples of which are illustrated in the accompanying drawings.

Figure 1:
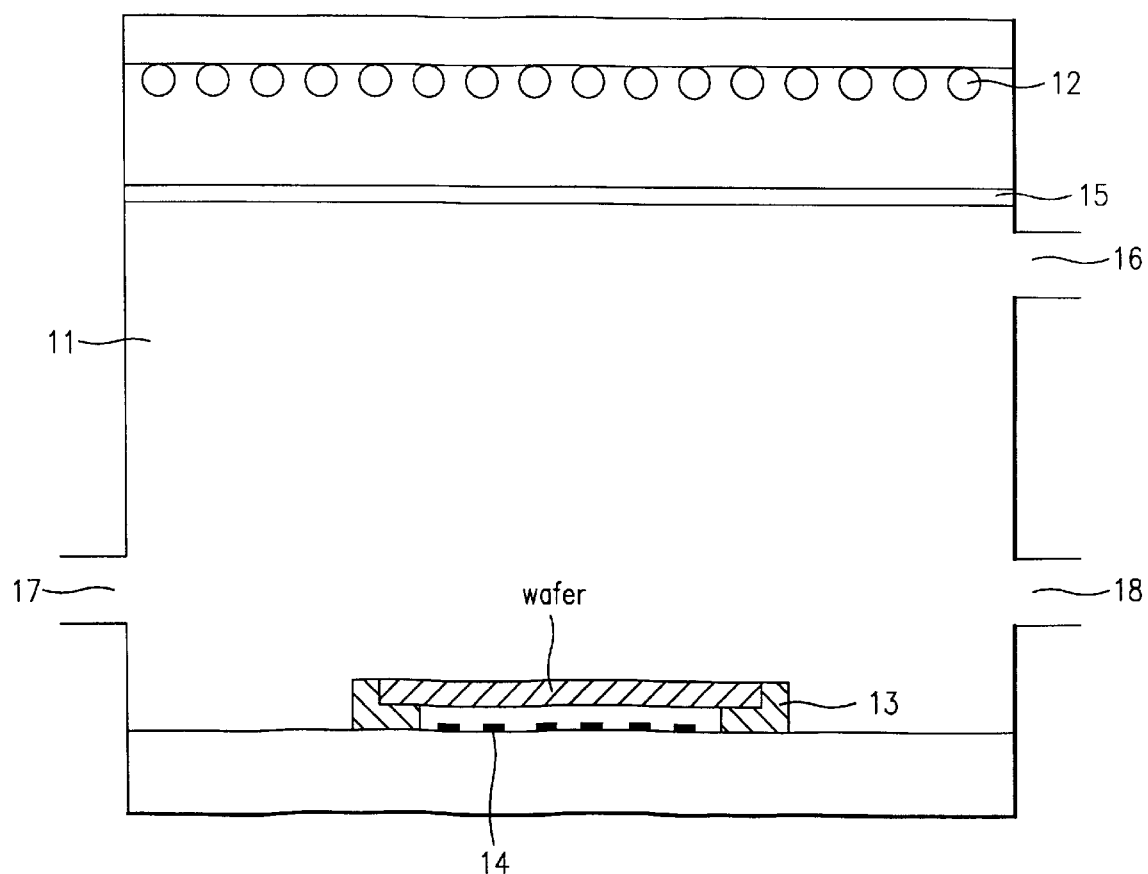
FIG. 1 is a view showing a conventional semiconductor manufacturing device.
Figure 2:
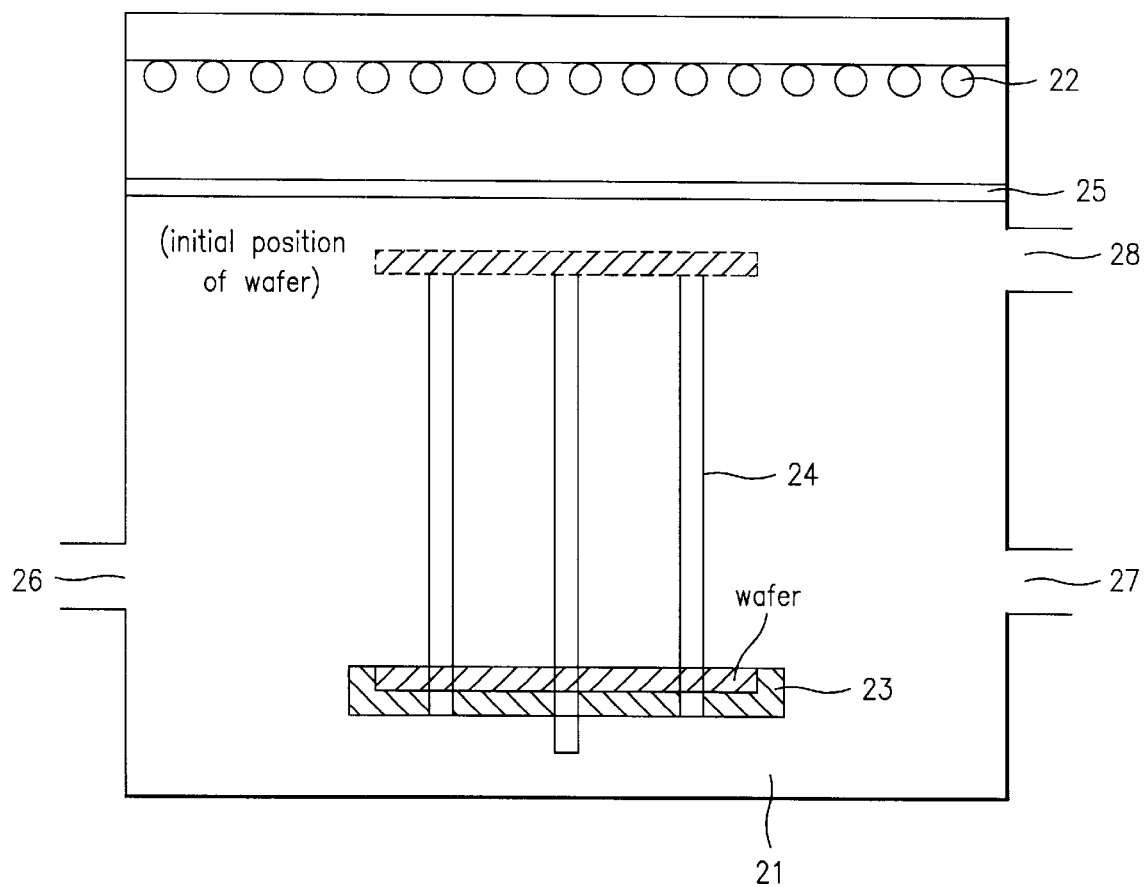
FIG. 2 is a view showing a semiconductor manufacturing device according to the embodiments of the present invention.

As illustrated in FIG. 2, a semiconductor manufacturing device according to the embodiments of the present invention includes a chamber 21, a plurality of lamps 22 disposed on the upper end of the chamber 21 to raise the chamber temperature to a predetermined processing temperature (suitable for growing films), a heat board 23 disposed on the lower end of the chamber 21 to maintain the chamber temperature at the predetermined processing temperature, a plurality of pyrometers 24 for detecting the chamber temperature, supporting a wafer until it is heated to the processing temperature by the lamps 22, and moving down the wafer to place the wafer on the heat board 23 when the chamber temperature reaches the processing temperature, a quartz 25 positioned between the wafer and the lamps 22, reaction gas inlet and outlet 26 and 27 formed on both sides of the chamber 21, and a wafer inlet or outlet 28 formed on one side of the chamber 21.

In operation, as illustrated in FIG. 2, when the wafer is being inserted into the chamber 21 through the wafer inlet 28, the pyrometers 24 are already elevated near the wafer inlet 28. The pyrometers 24 are vertically moved by a driving motor (not shown). The pyrometers 24 support the inserted wafer thereon close to the lamps 22. Here, the pyrometers 24 form a triangle, but other configurations may be formed with the pyrometers. Then, the lamps 22 disposed on the upper end of the chamber 21 are lit to raise the chamber temperature to the predetermined processing temperature and heat the wafer.

Figure 3:
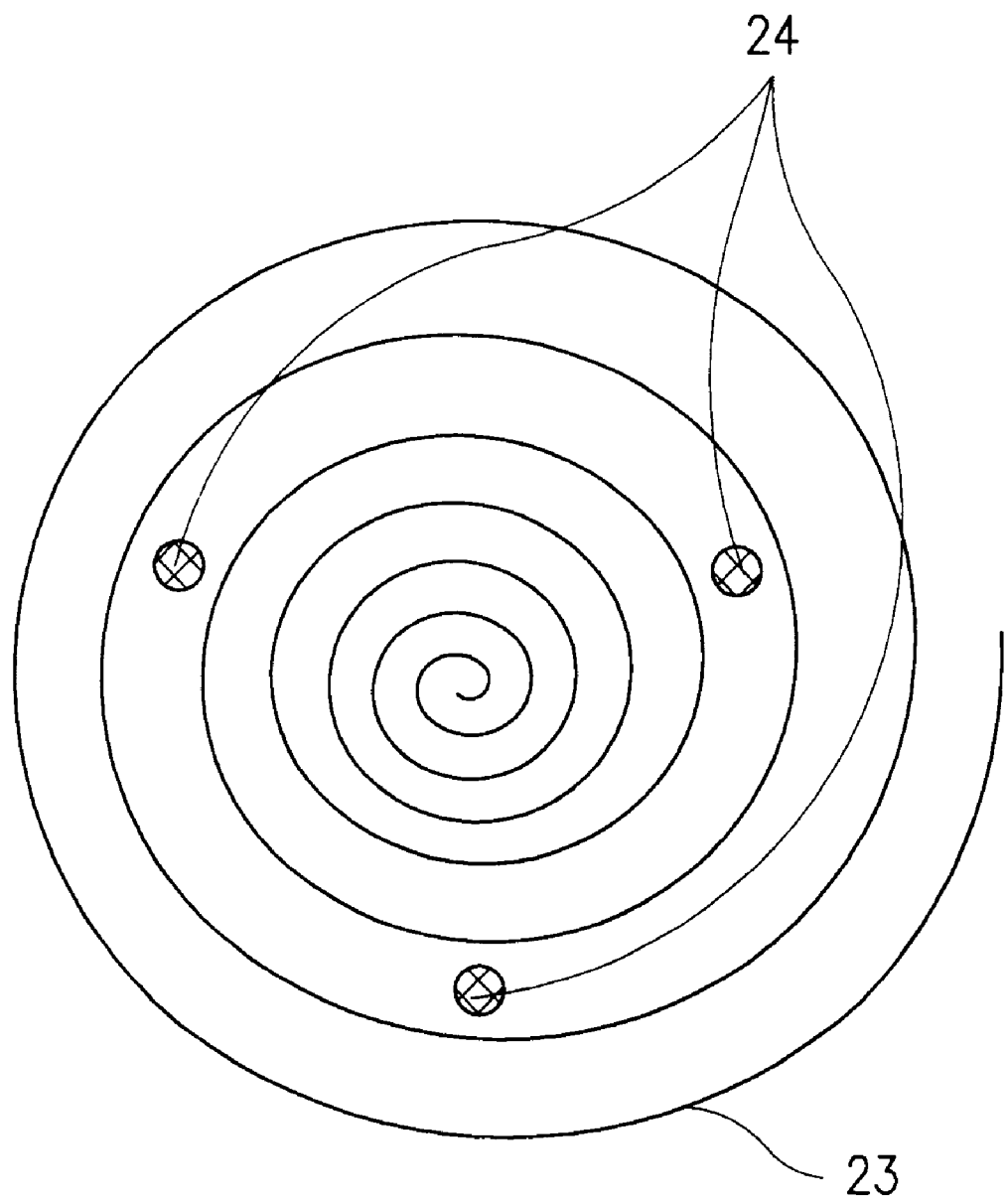
FIG. 3 shows an example of a heat board used in the semiconductor manufacturing device according to the embodiments of the present invention.

When the chamber temperature reaches the predetermined processing temperature (i.e., the wafer has been heated to a predetermined temperature), the pyrometers 24 having the wafer thereon descend to place the wafer on the heat board 23. The heat board 23 as shown in FIG. 3 is a spiral-type heating element made of SiC. The chamber temperature raised by the lamps 22 is maintained at the proper processing temperature by lowering the wafer onto the heat board 23. Although it is not shown, a control unit including the driving motor is provided to control the movement of the pyrometers 24.

The reaction gas is injected through the reaction gas inlet 26 as the wafer descends. The type of reaction gas being injected will vary depending on the kind of film being grown on the wafer surface. When the reaction gas is injected into the chamber 21, it reacts with the wafer's silicon to grow a reaction film. In order to improve uniformity in the film being grown, the heat board 23 may be rotated in accordance with the position of the reaction gas inlet 26.

As described above, the semiconductor manufacturing device of the present invention has many advantages and manifests desirable effects as follows.

First, pyrometers without conventional fixtures are used to support and move the wafer so that it becomes possible to accurately detect the chamber temperature.

Second, it has a plurality of heat sources (e.g., lamps and heat board) so that a proper processing temperature can be continuously maintained and a uniform film growth can be obtained.

Third, by using one heat source (e.g., lamps) to raise the chamber temperature and using another heat source (e.g., heat board) to maintain the chamber temperature at a predetermined level, the time per process unit is shortened and the turnaround time (TAT) is reduced.

It will be apparent to those skilled in the art that various modifications and variations can be made in accordance with the present invention without departing from the spirit or scope of the invention. Thus, it is intended that the present invention cover the modifications and variations of this invention provided they come within the scope of the appended claims and their equivalents.

What is claimed is:

1. A semiconductor manufacturing device for growing a film on a wafer, comprising:

a chamber having a plurality of openings;

a first heat source disposed on an upper portion of the chamber;

a second heat source disposed on a lower portion of the chamber for placing the wafer thereon and for uniformly heating the wafer; and at least one temperature detector for detecting a temperature of the chamber and being movable between the first and second heat sources, wherein the at least one temperature detector includes a plurality of pyrometers for supporting the wafer near the first heat source.

2. The semiconductor manufacturing device as claimed in claim 1, wherein the at least one temperature detector is a pyrometer.

3. The semiconductor manufacturing device as claimed in claim 1, wherein the pyrometers are positioned to form a predetermined shape.

4. The semiconductor manufacturing device as claimed in claim 3, wherein the predetermined shape includes a substantially triangular shape.

5. The semiconductor manufacturing device as claimed in claim 1, wherein the at least one temperature detector supports the wafer and is vertically movable to place the wafer on the second heat source.

6. The semiconductor manufacturing device as claimed in claim 1, wherein the at least one temperature detector is disposed in the second heat source.

7. The semiconductor manufacturing device as claimed in claim 1, wherein the first heat source includes at least one lamp.

8. The semiconductor manufacturing device as claimed in claim 1, wherein the second heat source is a heat board.

9. The semiconductor manufacturing device as claimed in claim 1, wherein the second heat source is rotatable to obtain a uniform thickness in the film.

10. The semiconductor manufacturing device as claimed in claim 1, wherein the at least one temperature detector is initially positioned near the first heat source, and lowers the wafer onto the second heat source when the temperature of the chamber reaches a predetermined temperature.

11. The semiconductor manufacturing device as claimed in claim 10, wherein the first heat source raises the temperature of the chamber up to the predetermined temperature, and the second heat source maintains the temperature of the chamber at the predetermined temperature.

12. The semiconductor manufacturing device as claimed in claim 1, wherein the second heat source is a spiral-type heating element made of SiC.

13. A semiconductor manufacturing device for growing a film on a wafer, comprising:
   a chamber having a plurality of openings;
   a first heat source disposed on an upper portion of the chamber;
   a second heat source disposed on a lower portion of the chamber to receive the wafer on a surface thereof; and
   a plurality temperature detectors being movable between the first and second heat sources and being able to support the wafer therebetween during movement.

14. The semiconductor manufacturing device as claimed in claim 13, wherein the plurality of temperature detectors are each pyrometers.

15. The semiconductor manufacturing device as claimed in claim 13, wherein only the plurality of temperature detectors support the wafer when the wafer is between the first and second heat sources.

16. The semiconductor manufacturing device as claimed in claim 15, wherein ends of the plurality of temperature detectors are positioned to form a predetermined shape.

17. The semiconductor manufacturing device as claimed in claim 16, wherein the predetermined shape includes a substantially triangular shape.

18. The semiconductor manufacturing device as claimed in claim 13, wherein the plurality of temperature detectors support the wafer and are vertically movable to place the wafer on the second heat source.

19. The semiconductor manufacturing device as claimed in claim 18, wherein the plurality of temperature detectors are initially positioned near the first heat source, and lower the wafer onto the second heat source when the temperature of the chamber reaches a predetermined temperature.

20. A semiconductor manufacturing device for growing a film on a wafer, comprising:
   a chamber having a plurality of openings;
   a first heat source disposed on an upper portion of the chamber;
   a second heat source disposed on a lower portion of the chamber to receive the wafer on a surface thereof, wherein the first heat source raises the temperature of the chamber up to a predetermined temperature, and the second heat source maintains the temperature of the chamber at the predetermined temperature; and
   at least one temperature detector being movable between the first and second heat sources.

21. The semiconductor manufacturing device as claimed in claim 20, wherein the at least one temperature detector supports the wafer and is vertically movable to place the wafer on the second heat source.

22. The semiconductor manufacturing device as claimed in claim 20, wherein the at least one temperature detector is initially positioned near the first heat source, and lowers the wafer onto the second heat source when the temperature of the chamber reaches the predetermined temperature.

* * * * *